(12) United States Patent
Qin et al.

(10) Patent No.: US 9,835,684 B2
(45) Date of Patent: Dec. 5, 2017

(54) IN-CIRCUIT TEST STRUCTURE FOR PRINTED CIRCUIT BOARD

(71) Applicant: NVIDIA Corporation, Santa Clara, CA (US)

(72) Inventors: Jinchai (Ivy) Qin, Shenzhen (CN); Bing Al, Shenzhen (CN)

(73) Assignee: Nvidia Corporation, Santa Clara, CA (US)

( * ) Notice: Subject to any disclaimer, the term of this patent is extended or adjusted under 35 U.S.C. 154(b) by 115 days.

(21) Appl. No.: 14/175,392

(22) Filed: Feb. 7, 2014

(65) Prior Publication Data

US 2014/0229783 A1 Aug. 14, 2014

(30) Foreign Application Priority Data

Feb. 8, 2013 (CN) .......................... 2013 1 0050664

(51) Int. Cl.
*G01R 31/3177* (2006.01)
*G01R 31/28* (2006.01)
(Continued)

(52) U.S. Cl.
CPC ..... *G01R 31/3177* (2013.01); *G01R 31/2818* (2013.01); *H05K 1/0268* (2013.01); *H05K 3/429* (2013.01); *H05K 2201/09481* (2013.01)

(58) Field of Classification Search
CPC ............ G01R 31/3177; G01R 31/2818; H05K 1/0268; H05K 3/429; H05K 2201/09481;
(Continued)

(56) References Cited

U.S. PATENT DOCUMENTS

| 4,922,140 A | 5/1990 | Gahle et al. |
| 5,553,276 A | 9/1996 | Dean |

(Continued)

FOREIGN PATENT DOCUMENTS

| CN | 101144741 | 3/2008 |
| CN | 102098028 | 6/2011 |

(Continued)

OTHER PUBLICATIONS

Harshada Vinayak Khare, "Design of an On-Chip Thermal Sensor Using Leakage Current Transistor", Jan. 2010, Thesis University of Minnesota.

(Continued)

*Primary Examiner* — Dipakkumar Gandhi

(57) ABSTRACT

A printed circuit board, an in-circuit test structure and a method for producing the in-circuit test structure thereof are disclosed. The in-circuit test structure comprises a via and a test pad. The via passes through the printed circuit board for communicating with an electrical device to be tested on the printed circuit board. The test pad is formed on an upper surface of the printed circuit board and covering the via, wherein a center of the via deviates from a center of the test pad. In the in-circuit test, the accuracy of the test data can be improved by means of the in-circuit test structure provided by the present invention, and thus the reliability of the test result is ensured. Also, the test efficiency of the in-circuit test is improved.

20 Claims, 3 Drawing Sheets

(51) Int. Cl.
*H05K 1/02* (2006.01)
*G01R 31/3185* (2006.01)
*H05K 3/42* (2006.01)

(58) Field of Classification Search
CPC .......... G11C 2207/105; H01L 23/4824; H01L 23/49503; H01L 2224/04042; H01L 2224/04; H01L 2224/13026; H01L 2224/17051; H01L 2224/17104
See application file for complete search history.

(56) References Cited

U.S. PATENT DOCUMENTS

| | | | |
|---|---|---|---|
| 5,835,553 A | 11/1998 | Suzuki | |
| 5,973,507 A | 10/1999 | Yamazaki | |
| 6,023,430 A | 2/2000 | Izumikawa | |
| 6,242,960 B1 | 6/2001 | Bae | |
| 6,401,018 B1 | 6/2002 | Oba et al. | |
| 6,420,207 B1 * | 7/2002 | Leuenberger | H01L 21/4853 257/678 |
| 6,535,013 B2 | 3/2003 | Samaan | |
| 6,535,071 B2 | 3/2003 | Forbes | |
| 6,724,225 B2 | 4/2004 | Joshi et al. | |
| 6,801,096 B1 | 10/2004 | Nariman et al. | |
| 6,854,100 B1 | 2/2005 | Chuang et al. | |
| 6,882,172 B1 | 4/2005 | Suzuki et al. | |
| 6,998,901 B2 | 2/2006 | Lee | |
| 7,064,620 B1 | 6/2006 | Lai et al. | |
| 7,085,658 B2 | 8/2006 | Bhushan et al. | |
| 7,151,417 B1 | 12/2006 | Suzuki | |
| 7,180,794 B2 | 2/2007 | Matsue | |
| 7,282,975 B2 | 10/2007 | Burton et al. | |
| 7,315,221 B2 | 1/2008 | Ha et al. | |
| 7,332,937 B2 | 2/2008 | Hsu et al. | |
| 7,365,611 B2 | 4/2008 | Ikeda et al. | |
| 7,489,204 B2 | 2/2009 | Habitz et al. | |
| 7,535,128 B2 | 5/2009 | Wang et al. | |
| 7,550,998 B2 | 6/2009 | Brazis et al. | |
| 7,592,876 B2 | 9/2009 | Newman | |
| 7,642,864 B2 | 1/2010 | Chuang et al. | |
| 7,760,033 B2 | 7/2010 | Podmanik et al. | |
| 7,795,927 B2 | 9/2010 | Farwell | |
| 7,804,372 B2 | 9/2010 | Nakatani | |
| 7,868,706 B2 | 1/2011 | Nissar et al. | |
| 7,908,109 B2 | 3/2011 | Good et al. | |
| 8,041,518 B2 | 10/2011 | McIntyre et al. | |
| 8,081,035 B2 | 12/2011 | Wood | |
| 8,143,919 B2 | 3/2012 | Kurokawa | |
| 8,193,833 B2 | 6/2012 | Inukai | |
| 8,247,906 B2 | 8/2012 | Law et al. | |
| 8,378,754 B2 | 2/2013 | Yamamoto | |
| 2003/0001185 A1 | 1/2003 | Sell et al. | |
| 2003/0034848 A1 | 2/2003 | Norman et al. | |
| 2005/0007154 A1 | 1/2005 | Patella et al. | |
| 2005/0012556 A1 | 1/2005 | Bhushan et al. | |
| 2006/0028241 A1 | 2/2006 | Apostol et al. | |
| 2006/0161797 A1 | 7/2006 | Grass et al. | |
| 2006/0178857 A1 | 8/2006 | Barajas | |
| 2007/0018663 A1 * | 1/2007 | Leinbach | G01R 3/00 324/754.03 |
| 2007/0273450 A1 | 11/2007 | Burton et al. | |
| 2008/0094053 A1 | 4/2008 | Han et al. | |
| 2008/0236876 A1 * | 10/2008 | Kodama | G02B 6/43 174/260 |
| 2009/0045834 A1 | 2/2009 | Farwell | |
| 2009/0096495 A1 | 4/2009 | Keigo | |
| 2010/0018916 A1 | 1/2010 | Zhang et al. | |
| 2010/0102891 A1 | 4/2010 | Nissar et al. | |
| 2010/0189160 A1 | 7/2010 | Kim et al. | |
| 2010/0327983 A1 | 12/2010 | Yamamoto | |
| 2011/0101998 A1 | 5/2011 | Myers et al. | |
| 2011/0108988 A1 * | 5/2011 | Lim | H01L 21/76898 257/751 |
| 2013/0027140 A1 | 1/2013 | Poppe et al. | |
| 2013/0106438 A1 | 5/2013 | Elkin et al. | |
| 2013/0106524 A1 | 5/2013 | Elkin et al. | |
| 2013/0110437 A1 | 5/2013 | Singh et al. | |

FOREIGN PATENT DOCUMENTS

| | | |
|---|---|---|
| DE | 102004001668 | 8/2005 |
| DE | 102006005848 | 8/2006 |
| DE | 10063996 | 6/2009 |
| KR | 10-2001-0035660 | 5/2001 |
| TW | 200403779 | 3/2004 |
| TW | 200419688 | 10/2004 |
| TW | I293793 B | 2/2008 |
| TW | 200943719 | 10/2009 |
| TW | 201103116 | 1/2011 |
| TW | 201114347 A | 4/2011 |
| TW | 201118392 | 6/2011 |

OTHER PUBLICATIONS

Klass, Fabian; "Design for Yield Using Statistical Design", EE380 Computer Systems Colloquium, Stanford University, Feb. 7, 2007.
Basab Datta, et al., "Analysis of a Ring Oscillator Based On Chip Thermal Sensor in 65nm Technology", VLSI Design Principles (ECE 658) Lab 4 Project, University of Massachusetts-Amherst, Dec. 23, 2005.

* cited by examiner

IN-CIRCUIT TEST STRUCTURE FOR PRINTED CIRCUIT BOARD

CROSS-REFERENCE TO RELATED APPLICATIONS

This application claims priority to Chinese Patent Application No. 201310050664.4, filed on Feb. 8, 2013, which is hereby incorporated by reference in its entirety.

FIELD OF INVENTION

Embodiments of the present invention relate generally to the field of printed circuit boards, and more particularly to in-circuit test structures for printed circuit boards.

BACKGROUND

In-circuit tests (ICTs) are the tests for electrical properties of electrical elements in printed circuit boards (PCBs) and electrical connections between the electrical elements. The in-circuit tests can be used to detect the potential manufacturing defects in the printed circuit boards, e.g., open or short circuits, and the reliabilities of the electrical elements by measuring the resistances, capacities and other characteristics of each electrical element. The in-circuit tests are standard tests aimed at printed circuit boards. The in-circuit tests offer advantages, such as simple operation, high efficiency and accurate defect positioning, etc.

One approach of in-circuit tests is to produce a via in a multilayer printed circuit board for as a conducting channel between an electrical element and the circuits on the PCB and a test probe. And a test pad coupled with the via is produced on the upper surface of the printed circuit board so that the electrical element and the circuit are electrically connected to the exterior of the printed circuit board. A test probe of a test apparatus contacts with the center of the test pad to test the electrical properties of the printed circuit board.

As shown in FIG. 2, in producing the in-circuit test structure, a via 210 is initially formed in a printed circuit board 200, and then a test pad 230 is formed on the upper surface of the printed circuit 200. Conventionally, the center of the test pad 230 is located right above the via 210, and the center part of the test pad 230 may recess toward the via 210. The recession can cause reduced thickness and the increased resistance of the center part of the test pad 230. When the electrical test is carried out, it often deviates the test result, if the test probe contacts with this part of the test pad 230.

Moreover, typically a via needs to be plugged with soldermask to avoid electrical short and oxidation. For solder-opened via, one side of the via is soldermask plugged, and the other side having a big test pad remains solder-open for contacting the probe tip. During this type of process, the solder mask may seep into the solder-opened side of the via from the soldermask-plugged side, thereby affecting the contact between the test probe and the test pad.

But in the practical testing process, the test data often deviates from the actual data. Sometimes, the test data cannot even be obtained.

SUMMARY OF THE INVENTION

Accordingly, there is a need for providing a printed circuit board, an in-circuit test structure and a method for producing the in-circuit test structure thereof to provide accurate test data. Embodiments of the present invention provide an in-circuit test structure having a center of the via deviates from the center of a test pad. Thereby, the accuracy and the reliability of the test data are improved. Also, the test efficiency of the in-circuit test is improved.

According to one aspect of the present invention, an in-circuit test structure for a printed circuit board is provided. The in-circuit test structure comprises a via and a test pad. The via passes through the printed circuit board for communicating with an electrical device to be tested on the printed circuit board. The test pad is used for forming on an upper surface of the printed circuit board and covering the via, wherein a center of the via deviates from a center of the test pad. In some embodiments, the distance between the center of the test pad and the center of the via may be larger than a radius of the via. Preferably, a difference between the distance and the radius of the via is larger than a contact radius between a test probe and the test pad.

Preferably, the in-circuit test structure further comprises a conducting layer located on an inner wall of the via and extending out of the via.

Preferably, the via is filled with a solder mask.

Preferably, a diameter of the test pad may be the range of 0.5 mm-1.27 mm.

Preferably, a diameter of the via may be in the range of 0.2 mm-0.5 mm.

Preferably, a region on the test pad for contacting with a test probe is located at the centre of the test pad.

According to another embodiment of the present invention, a printed circuit board is further provided. The printed circuit board has a multilayer stack structure and comprises an in-circuit test structure. The in-circuit structure comprises a via and a test pad. The via passes through the printed circuit board and electrically conducts with an electrical device to be tested on the printed circuit board. The test pad is formed on an upper surface of the printed circuit board and covers the via, wherein a center of the via deviates from a center of the test pad. In some embodiments, the distance between the center of the test pad and the center of the via may be larger than a radius of the via. A difference between the distance and the radius of the via may be larger than a contact radius between a test probe and the test pad. The in-circuit test structure further may comprise a conducting layer located on an inner wall of the via and extending out of the via.

According to still another embodiment of the present invention, a method for producing an in-circuit test structure for a printed circuit board comprises forming a via in the printed circuit board, wherein the via passes through the printed circuit board and electrically coupled to an electrical device to be tested of the printed circuit board. The method further comprises forming a test pad on an upper surface of the printed circuit board, wherein the test pad covers the via, and wherein a center of the via deviates from a center of the test pad. In some embodiments, the method further comprises forming a conducting layer on an inner wall of the via, wherein the conducting layer extends out of the via. The conducting layer may be made of Copper formed by electroplating. The method may further comprise filling the via with a solder mask from a lower surface of the printed circuit board.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
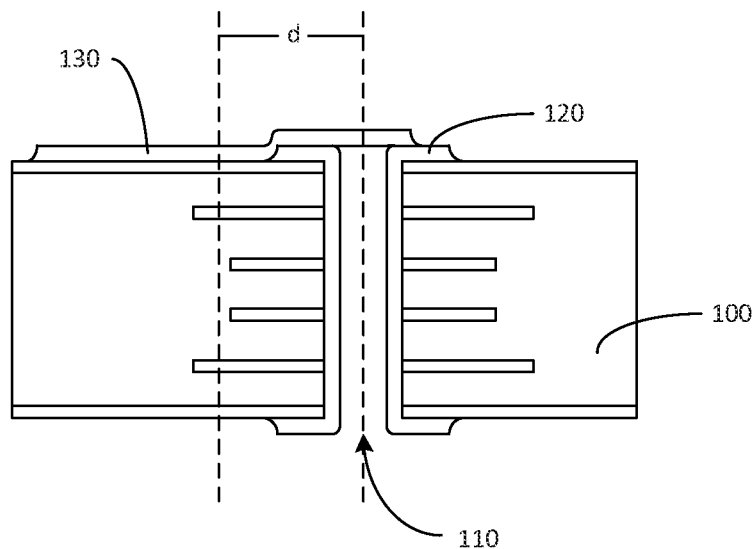
FIG. 1 illustrates an exemplary configuration of a printed circuit board in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

A printed circuit board is provided by an embodiment of the present invention. The printed circuit board has an in-circuit test structure provided by the present invention. FIG. 1 illustrates an exemplary configuration of a printed circuit board in accordance with one embodiment of the present invention.

As shown in FIG. 1, the printed circuit board 100 has a multilayer stack structure. It is appreciated that the printed circuit board 100 comprises multiple layers of sub-printed circuit boards which are combined together. The printed circuit board 100 includes electrical devices. The electrical devices comprise the circuits formed on surfaces of the sub-printed circuit boards and the electrical elements connected to the printed circuit board 100. During the in-circuit test, the in-circuit test structure(s) is produced in one or more regions to be tested on the printed circuit board 100 according to the test purpose. The in-circuit test structure is used for connecting a part of the electrical devices to the exterior of the printed circuit board. Thus, the test data indicating electrical properties is able to be obtained by contacting the probe in the test apparatus with the in-circuit test structure.

Since other components comprised in the printed circuit board 100 are known in the art, only the in-circuit test structure is described in detail herein. Referring to FIG. 1, the in-circuit test structure comprises a via 110 and a test pad 130.

The via 110 passes through the printed circuit board 100 to communicate with an electrical device to be tested on the printed circuit board. In one embodiment, the in-circuit test structure further comprises a conducting layer 120. The conducting layer 120 is located on an inner wall of the via 110 and extends out of the via 110. The conducting layer 120 electrically connects the electrical device to be tested with the test pad 130. In one embodiment, the via 110 may be produced by any drilling or hole-making equipment in the prior art. In one embodiment, the diameter of the via 110 is in the range of 0.2 mm-0.5 mm.

The test pad 130 is formed on an upper surface of the printed circuit board 100. The "upper surface" mentioned herein is relative to the placement of the printed circuit board 100. In general, the surface connected to the electrical element is placed upward. Naturally, the inverse placement of the printed circuit board 100 is not excluded from the present invention. The test pad 130 covers the via 110 to connect the electrical device communicated with the via 110 to the exterior of the printed circuit board 100. The "covering" mentioned herein comprises a direct covering that the test pad 130 covers one end of the via 110 directly. Furthermore, the "covering" further comprises an indirect covering that other conducting layer is located between the test pad 130 and the via 110. In one embodiment, the diameter of the test pad 130 is in the range of 0.5 mm-1.27 mm.

Figure 2:
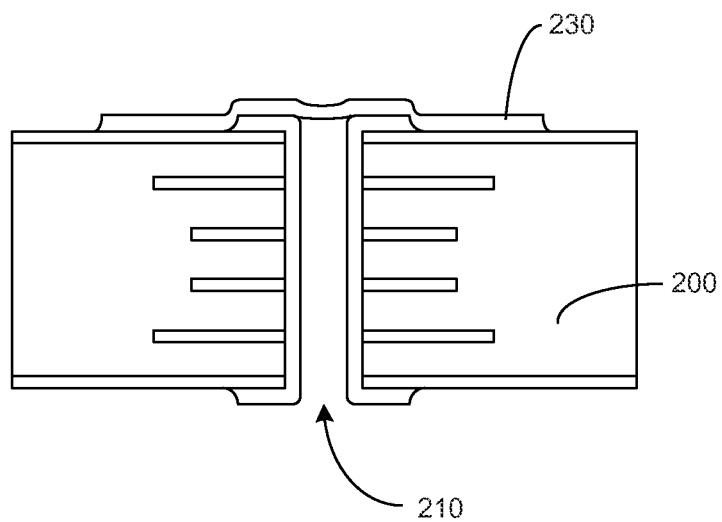
FIG. 2 illustrates that the test pad recesses toward the via.

In researching the inaccuracy of the test results of the in-circuit test, it has been discovered that it may be caused by the following situations during the in-circuit test. As shown in FIG. 2, in producing the in-circuit test structure, a via 210 is initially formed in a printed circuit board 200, and then a test pad 230 is formed on the upper surface of the printed circuit 200. Since a part of the test pad 230 forms right above the via 210, this part of the test pad 230 may recess toward the via 210. This results in the reduced thickness and the increased resistance of this part of the test pad 230. When the electrical test is carried out, it inevitably results in the deviation of the test result, if the test probe merely contacts with this part of the test pad 230.

In practice, the test engineer normally contacts the center of the test pad by the probe to perform the in-circuit test. Referring back to FIG. 1, the in-circuit test structure provided by an embodiment of the present invention is configured such that the center of the via 110 deviates from the center of the test pad 130. Since the portion which is the closest to the center of the via 110 of the test pad 130 tends to be affected by the via 110 most, the arrangement that the center of the via deviates from the center of the test pad 130 can advantageously reduce the impact of the via 110 on the thickness of the center of the test pad 130. Thus, the impact of the structural change of the test pad 130 on the test result is reduced, when the test is performed by contacting the center of the test pad 130 with the probe.

In one embodiment, the distance d between the center of the test pad 130 and the center of the via 110 is larger than the radius of the via 110. Thus, the impact of the via 110 on the center of the test pad 130 can be avoided, and further, the accuracy of the test result is improved.

In another embodiment, the difference between the distance which is between the center of the test pad 130 and the center of the via 110 and the radius of the via 110 is larger than a contact radius between the test probe and the test pad 130. Considering that the contact between the test probe and the test pad 130 is a surface contact, therefore, this embodiment can reduce the impact of the via 110 on the region to be tested of the test pad 130 to greatest large extent. Thus the test result is much closer to the actual data.

In one embodiment, the via 110 is filled with a solder mask (not shown). The solder mask will be described in detail when the method provided by the present invention is explained below.

FIGS. 3A-3D are cross-sectional views illustrating an exemplary method of producing the in-circuit test structure in accordance with one embodiment of the present invention. The producing method will be described in combination with FIGS. 3A-3D.

Figure 3A:
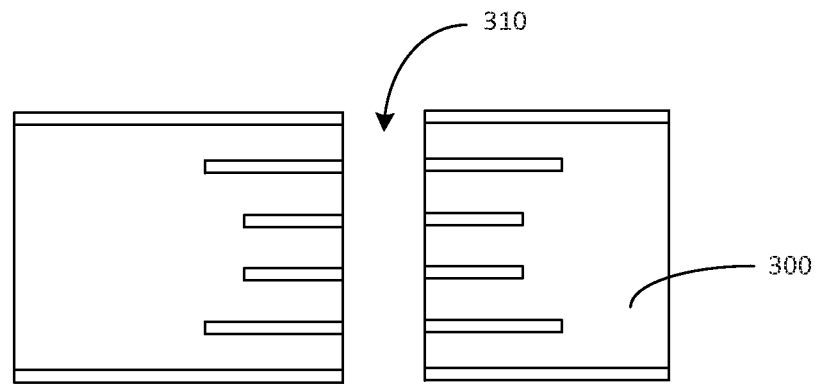
FIGS. 3A-3D are cross-sectional views illustrating an exemplary method of producing the in-circuit test structure in accordance with one embodiment of the present invention.

As shown in FIG. 3A, a printed circuit board 300 with a multilayer stack structure is initially provided. As mentioned above, the printed circuit board 300 is provided with an electrical device. The electrical device comprises the circuits formed on surfaces of the sub-printed circuit boards and the electrical elements connected to the printed circuit board 300.

Continuing to refer to FIG. 3A, a via 310 passing through the printed circuit board 300 is then formed in the printed circuit board 300. The via 310 is coupled with the electrical devices to be tested on the printed circuit board 300. In one embodiment, a diameter of the via 310 may be in the range of 0.2 mm-0.5 mm.

Figure 3B:
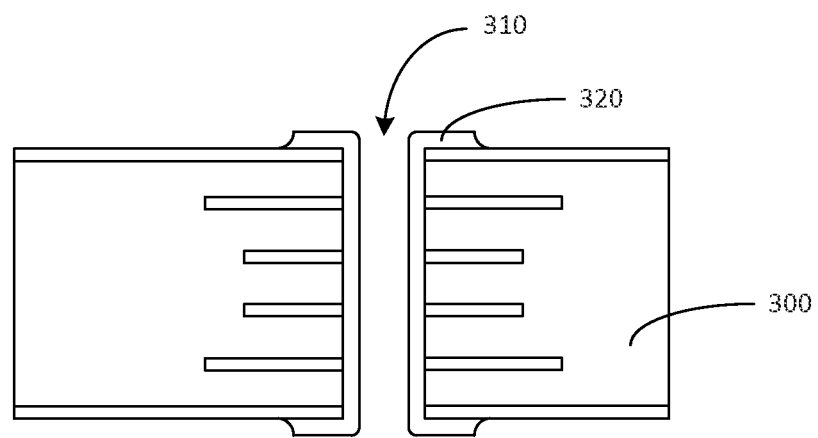

Referring to FIG. 3B, in some embodiments, a conducting layer 320 is formed on an inner wall of the via 310. The conducting layer 320 extends out of the via 310. In one embodiment, the conducting layer 320 is made of Copper. Copper has a lower resistivity, and copper is easily formed as a thin film on the surface of the device. As an example, the conducting layer 320 is formed by electroplating. The thin film formed by the electroplating is uniform and dense. And, the thickness of the thin film can be controlled. Furthermore, the electroplating is simple and the production cost is lower.

Figure 3C:
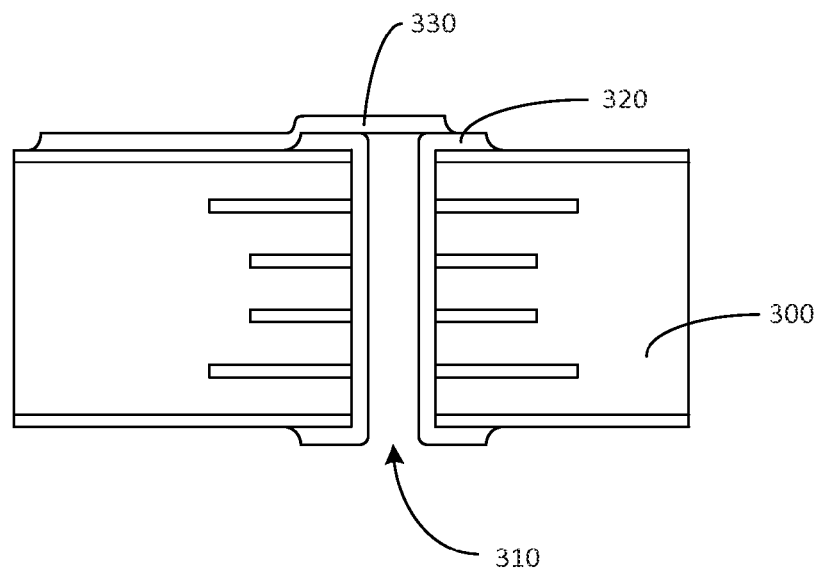

As shown in FIG. 3C, a test pad 330 is then formed on an upper surface of the printed circuit board 300. The test pad 330 covers the via 310, and the center of the via 310 deviates from the center of the test pad 330. In one embodiment, the diameter of the test pad 330 is in the range of 0.5 mm-1.27 mm. In another embodiment, the distance between the center of the test pad 330 and the center of the via 310 is larger than the radius of the via 310. In one embodiment, the difference between the distance which is between the center of the test pad 330 and the center of the via 310 and the radius of the via 310 is larger than a contact radius between the test probe and the test pad 330.

Figure 3D:
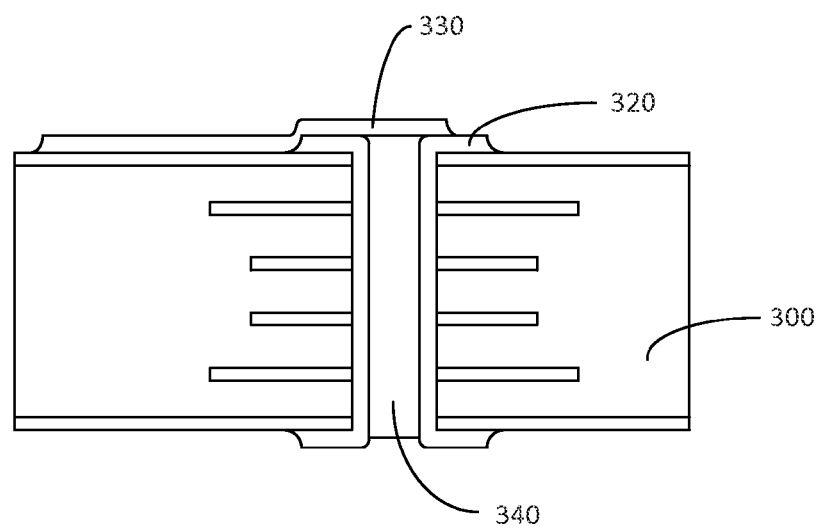

In some embodiments, as shown in FIG. 3D, after forming the test pad 330, the method further comprises filling the via 310 with a solder mask 340 from a lower surface of the printed circuit board 300. The structure exposed by the via 310 can be prevented from oxidization through filling the via 310 with the solder mask 340. The solder mask 340 may be formed by coating. In some embodiments, the solder mask is filled from a lower surface of the printed circuit board 300 and stops just at the upper surface of the printed circuit board 300. In some embodiments, the solder mask is initially filled in the via 310 and then the test pad 230 is produced.

In the in-circuit test, the accuracy of the test data can be improved by means of the in-circuit test structure provided by an embodiment of the present invention, and thus the reliability of the test result is ensured. Also, the test efficiency of the in-circuit test is improved.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. An in-circuit test structure for a printed circuit board, the test structure comprising:
a via passing through the printed circuit board for electrically conducting with an electrical device to be tested on the printed circuit board; and
a test pad formed on an upper surface of the printed circuit board and covering the via, wherein a center of the via deviates from a center of the test pad in a predetermined configuration.

2. The in-circuit test structure according to claim 1, wherein a distance between the center of the test pad and the center of the via is larger than a radius of the via.

3. The in-circuit test structure according to claim 2, wherein a difference between the distance and the radius of the via is larger than a contact radius between a test probe and the test pad.

4. The in-circuit test structure according to claim 1, wherein the in-circuit test structure further comprises a conducting layer located on an inner wall of the via and extending external to the via.

5. The in-circuit test structure according to claim 1, wherein the via is filled with a solder mask.

6. The in-circuit test structure according to claim 1, wherein a diameter of the test pad is substantially in the range of 0.5 mm-1.27 mm.

7. The in-circuit test structure according to claim 1, wherein a diameter of the via is substantially in the range of 0.2 mm-0.5 mm.

8. The in-circuit test structure according to claim 1, wherein a region on the test pad for contacting with a test probe is located at the center of the test pad.

9. A printed circuit board, comprising a multilayer stack structure; and an in-circuit test structure, wherein the in-circuit structure comprises:
a via passing through the printed circuit board and communicating with an electrical device to be tested on the printed circuit board; and
a test pad formed on an upper surface of the printed circuit board and covering the via, wherein a center of the via deviates from a center of the test pad in a predetermined configuration.

10. The printed circuit board according to claim 9, wherein a distance between the center of the test pad and the center of the via is larger than a radius of the via.

11. The printed circuit board according to claim 10, wherein a difference between the distance and the radius of the via is larger than a contact radius between a test probe and the test pad.

12. The printed circuit board according to claim 9, wherein the in-circuit test structure further comprises a conducting layer located on an inner wall of the via and extending out of the via.

13. The printed circuit board according to claim 9, wherein the via is filled with a solder mask.

14. A method for producing an in-circuit test structure for a printed circuit board, said method comprising:
   forming a via in the printed circuit board that has a multilayer stack structure, wherein the via passes through the printed circuit board and electrically conducts with an electrical device to be tested on the printed circuit board; and
   forming a test pad on an upper surface of the printed circuit board, wherein the test pad covers the via, and wherein a center of the via deviates from a center of the test pad in a predetermined configuration.

15. The method according to claim 14, wherein between the forming the via and the forming the test pad, the method further comprises forming a conducting layer on an inner wall of the via, wherein the conducting layer extends out of the via.

16. The method according to claim 15, wherein the conducting layer is made of Copper.

17. The method according to claim 16, wherein the conducting layer is formed by electroplating.

18. The method according to claim 14, wherein a distance between the center of the test pad and the center of the via is larger than a radius of the via.

19. The method according to claim 18, wherein a difference between the distance and the radius of the via is larger than a contact radius between a test probe and the test pad.

20. The method according to claim 14 further comprising filling the via with a solder mask from a lower surface of the printed circuit board.

* * * * *